United States Patent
Ohyama et al.

(10) Patent No.: US 10,513,231 B2
(45) Date of Patent: Dec. 24, 2019

(54) ELECTRONIC COMPONENT UNIT, WIRE HARNESS, AND CONNECTOR FIXING STRUCTURE

(71) Applicants: Yazaki Corporation, Tokyo (JP); Mitsubishi Electric Corporation, Tokyo (JP)

(72) Inventors: Kouichi Ohyama, Shizuoka (JP); Mitsunori Nishida, Tokyo (JP); Osamu Nishizawa, Tokyo (JP)

(73) Assignees: YAZAKI CORPORATION, Minato-ku, Tokyo (JP); Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/835,705

(22) Filed: Dec. 8, 2017

(65) Prior Publication Data
US 2018/0370460 A1   Dec. 27, 2018

(30) Foreign Application Priority Data

Jun. 21, 2017   (JP) .................................. 2017-121584

(51) Int. Cl.
*B60R 16/02* (2006.01)
*B60R 16/03* (2006.01)
(Continued)

(52) U.S. Cl.
CPC .......... *B60R 16/0207* (2013.01); *B60R 16/03* (2013.01); *H01B 13/01209* (2013.01);
(Continued)

(58) Field of Classification Search
CPC ........................... H01R 12/724; H01R 12/712; H01R 12/7005; H01R 12/7017; H01R 12/7023;
(Continued)

(56) References Cited

U.S. PATENT DOCUMENTS 5,257,947 A * 11/1993 Scheer ..................... H05K 7/12
29/856
5,906,518 A *  5/1999 Sun ...................... H01R 13/193
439/295
(Continued)

FOREIGN PATENT DOCUMENTS

JP          63-27074 U     2/1988
JP          04-25166 U1    2/1992
(Continued)

OTHER PUBLICATIONS

English Translation of JP 2003249775.*
(Continued)

*Primary Examiner* — Edwin A. Leon
*Assistant Examiner* — Matthew T Dzierzynski
(74) *Attorney, Agent, or Firm* — Sughrue Mion, PLLC (57) ABSTRACT

An electronic component unit of a wire harness includes a substrate on which an electronic component is mounted, a connector electrically connected to the substrate, and a connector fixing structure. The connector fixing structure includes a pair of notches that are provided facing each other on the substrate in a facing direction; a pair of press fitting plates that are provided on the connector and press-fitted into the respective notches; a positioning rib formed projecting from each of the press fitting plates toward the inside in the facing direction, having a width smaller than the width of the press fitting plates, and brought into contact with the substrate while the press fitting plates are press-fitted into the respective notches; and a deformation acceptable space provided adjacent to the outside of the press fitting plates that are press-fitted into the respective notches, in the facing direction.

10 Claims, 5 Drawing Sheets

(51) Int. Cl.
  *H01R 12/61* (2011.01)
  *H01R 12/57* (2011.01)
  *H01R 12/77* (2011.01)
  *H01R 4/2429* (2018.01)
  *H01B 13/012* (2006.01)

(52) U.S. Cl.
  CPC .......... *H01R 4/2429* (2013.01); *H01R 12/57* (2013.01); *H01R 12/616* (2013.01); *H01R 12/778* (2013.01)

(58) Field of Classification Search
  CPC .......... H01R 12/7029; H01R 12/7047; H01R 12/716; H01R 13/516; H05K 3/301; H05K 7/12
  See application file for complete search history.

(56) References Cited

U.S. PATENT DOCUMENTS

| | | | | |
|---|---|---|---|---|
| 6,312,287 | B1* | 11/2001 | Harting | H01R 9/0515 439/581 |
| 6,863,549 | B2* | 3/2005 | Brunker | H01R 13/6477 439/108 |
| 6,866,552 | B2* | 3/2005 | Koehler | H01R 12/724 439/892 |
| 6,923,678 | B2* | 8/2005 | Kato | H05K 3/301 439/567 |
| 7,094,075 | B1* | 8/2006 | Lim | H01R 13/508 439/76.1 |
| 7,121,885 | B2* | 10/2006 | Li | H01R 4/027 439/607.01 |
| 7,179,094 | B2* | 2/2007 | Kawahara | H01R 4/028 439/74 |
| 7,214,074 | B2* | 5/2007 | Osada | H01R 12/712 439/79 |
| 7,267,562 | B2* | 9/2007 | Katsuma | H01R 13/516 439/140 |
| 7,320,619 | B2* | 1/2008 | Takahashi | H01R 12/7017 439/567 |
| 7,357,670 | B2* | 4/2008 | Tanaka | H01R 12/7017 439/567 |
| 8,435,051 | B2* | 5/2013 | Tonosaki | H01R 12/724 439/567 |
| 8,553,429 | B2* | 10/2013 | McNamara | H05K 3/301 361/801 |
| 9,882,295 | B2* | 1/2018 | Miura | H01R 12/7005 |
| 2003/0166348 | A1* | 9/2003 | Martin | H01R 12/724 439/79 |
| 2006/0063401 | A1 | 3/2006 | Ariga et al. | |
| 2014/0065887 | A1 | 3/2014 | Kida et al. | |

FOREIGN PATENT DOCUMENTS

| | | |
|---|---|---|
| JP | 06-15284 A | 2/1994 |
| JP | 2003-249775 A | 9/2003 |
| JP | 2003-346950 A | 12/2003 |
| JP | 2005-101088 A | 4/2005 |
| JP | 2011-18552 A | 1/2011 |
| JP | 2014-49331 A | 3/2014 |

OTHER PUBLICATIONS

Suzuki Motor Corporation, "Suzuki Launches the All-new WagonR and WagonR Stingray Minicars in Japan", Press Release, Feb. 1, 2017, total 2 pages.

Communication dated Jun. 4, 2019, from the Japanese Patent Office in counterpart application No. 2017-121584.

* cited by examiner

ELECTRONIC COMPONENT UNIT, WIRE HARNESS, AND CONNECTOR FIXING STRUCTURE

CROSS-REFERENCE TO RELATED APPLICATION(S)

The present application claims priority to and incorporates by reference the entire contents of Japanese Patent Application No. 2017-121584 filed in Japan on Jun. 21, 2017.

BACKGROUND OF THE INVENTION

1. Field of the Invention

The present invention relates to an electronic component unit, a wire harness, and a connector fixing structure.

2. Description of the Related Art

For example, as a technique relating to a conventional electronic component unit applied to a wire harness and the like in a vehicle, Japanese Patent Application Laid-open No. 2003-249775 discloses a substrate fixing structure for fixing a measuring instrument. In the substrate fixing structure, a substrate is fixed to the inner surface of a casing of the measuring instrument, by forcibly press-fitting a press fitting boss projecting from the inner surface of the casing into a fixing hole formed on the substrate. In the substrate fixing structure, peripheral walls for defining a sealed space around the press fitting boss are projecting from the inner walls of the casing so as to surround the press fitting boss, by bringing the tip end portions of the peripheral walls into contact with the substrate.

For example, in the substrate fixing structure disclosed in Japanese Patent Application Laid-open No. 2003-249775 disclosed above, a connector is provided on the substrate in some cases. In such cases, the fixing structure of the connector to the substrate can stand further improvement.

SUMMARY OF THE INVENTION

The present invention has been made in view of the above circumstances, and the object of the present invention is to provide an electronic component unit, a wire harness, and a connector fixing structure capable of suitably fixing the connector to the substrate.

In order to achieve the above mentioned object, an electronic component unit according to one aspect of the present invention includes a substrate on which an electronic component is mounted; a connector electrically connected to the substrate; and a connector fixing structure including: a pair of notches that are provided facing each other on the substrate in a facing direction and that penetrate through the substrate in a plate thickness direction, a pair of press fitting plates that are provided on the connector and that are press-fitted into the respective notches, a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches, and a deformation acceptable space that is provided adjacent to outside of the press fitting plates that are press-fitted into the respective notches, in the facing direction.

According to another aspect of the present invention, in the electronic component unit, it is possible to configure that the positioning rib includes a base end portion that is placed at the press fitting plate side in the facing direction, and a tip end portion that is placed at the substrate side in the facing direction, that has a width in the intersecting direction smaller than a width of the base end portion, and that is brought into contact with the substrate while the press fitting plates are press-fitted into the respective notches.

According to still another aspect of the present invention, in the electronic component unit, it is possible to configure that a corner of the notches is formed in a curved-shape, and the positioning rib is brought into contact with the substrate at a position shifted from the corner having the curved-shape while the press fitting plates are press-fitted into the respective notches.

According to still another aspect of the present invention, in the electronic component unit, it is possible to configure that between the substrate and the connector, a linear expansion coefficient of the substrate is relatively small, and a linear expansion coefficient of the connector is relatively large.

In order to achieve the above mentioned object, a wire harness according to still another aspect of the present invention includes a conductive wiring material; and an electronic component unit electrically connected to the wiring material, wherein the electronic component unit includes: a substrate on which an electronic component electrically connected to the wiring material is mounted, a connector electrically connected to the substrate, and a connector fixing structure including: a pair of notches that are provided facing each other on the substrate in a facing direction and that penetrate through the substrate in a plate thickness direction, a pair of press fitting plates that are provided on the connector and that are press-fitted into the respective notches, a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches, and a deformation acceptable space that is provided adjacent to outside of the press fitting plates that are press-fitted into the respective notches, in the facing direction.

In order to achieve the above mentioned object, a connector fixing structure according to still another aspect of the present invention includes a pair of notches that are provided facing each other on a substrate on which an electronic component is mounted in a facing direction and that penetrate through the substrate in a plate thickness direction; a pair of press fitting plates that are provided on a connector electrically connected to the substrate and that are press-fitted into the respective notches; a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches; and a deformation acceptable space that is provided adjacent to outside of the press fitting plates that are press-fitted into the respective notches, in the facing direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the accompanying drawings. It is to be noted that the present invention is not limited to the embodiment. Moreover, components in the following embodiment include components that can be easily replaced by a person skilled in the art or components that are substantially the same.

Figure 1:
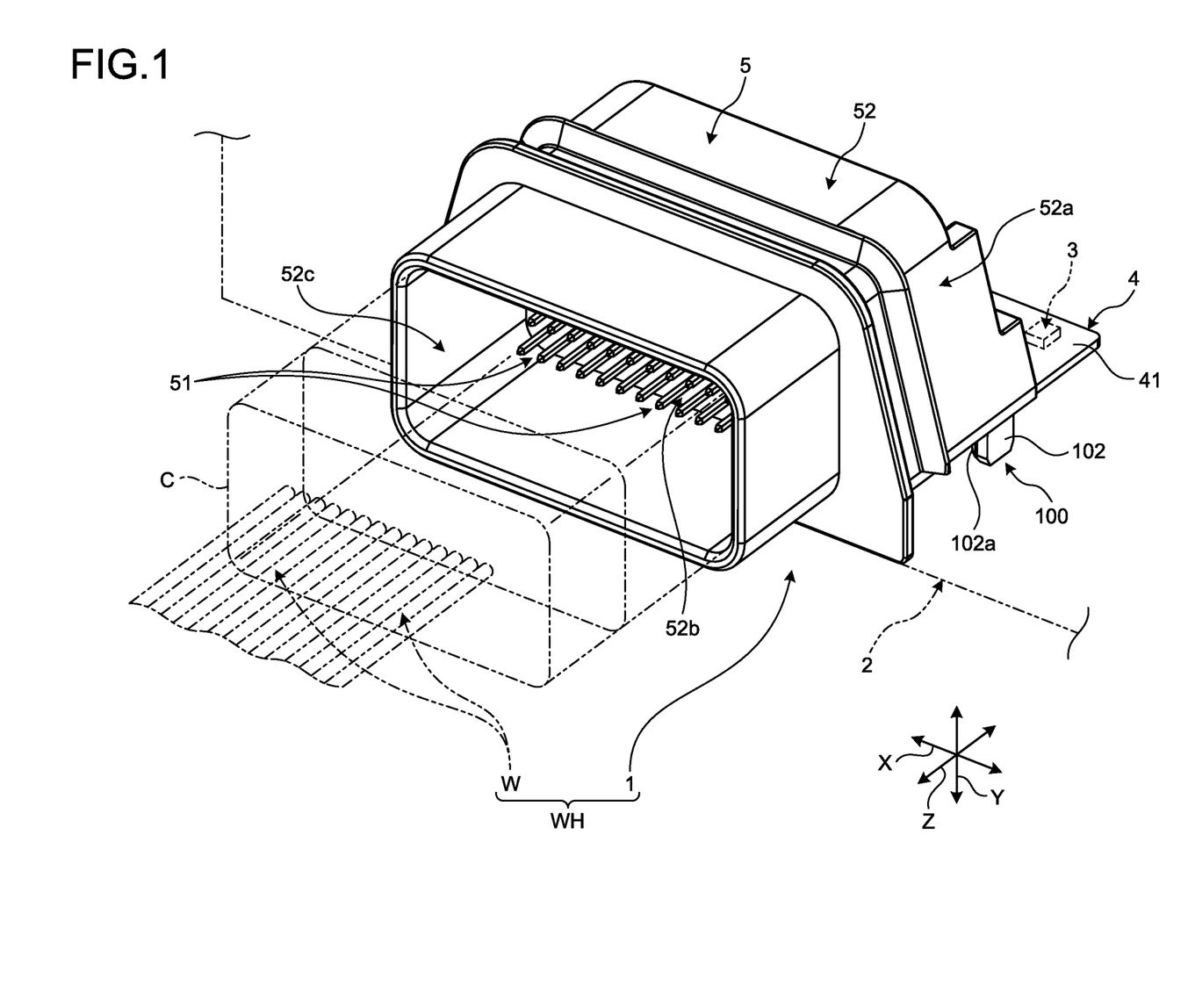
FIG. 1 is a perspective view illustrating a schematic configuration of an electronic component unit according to an embodiment.
Figure 2:
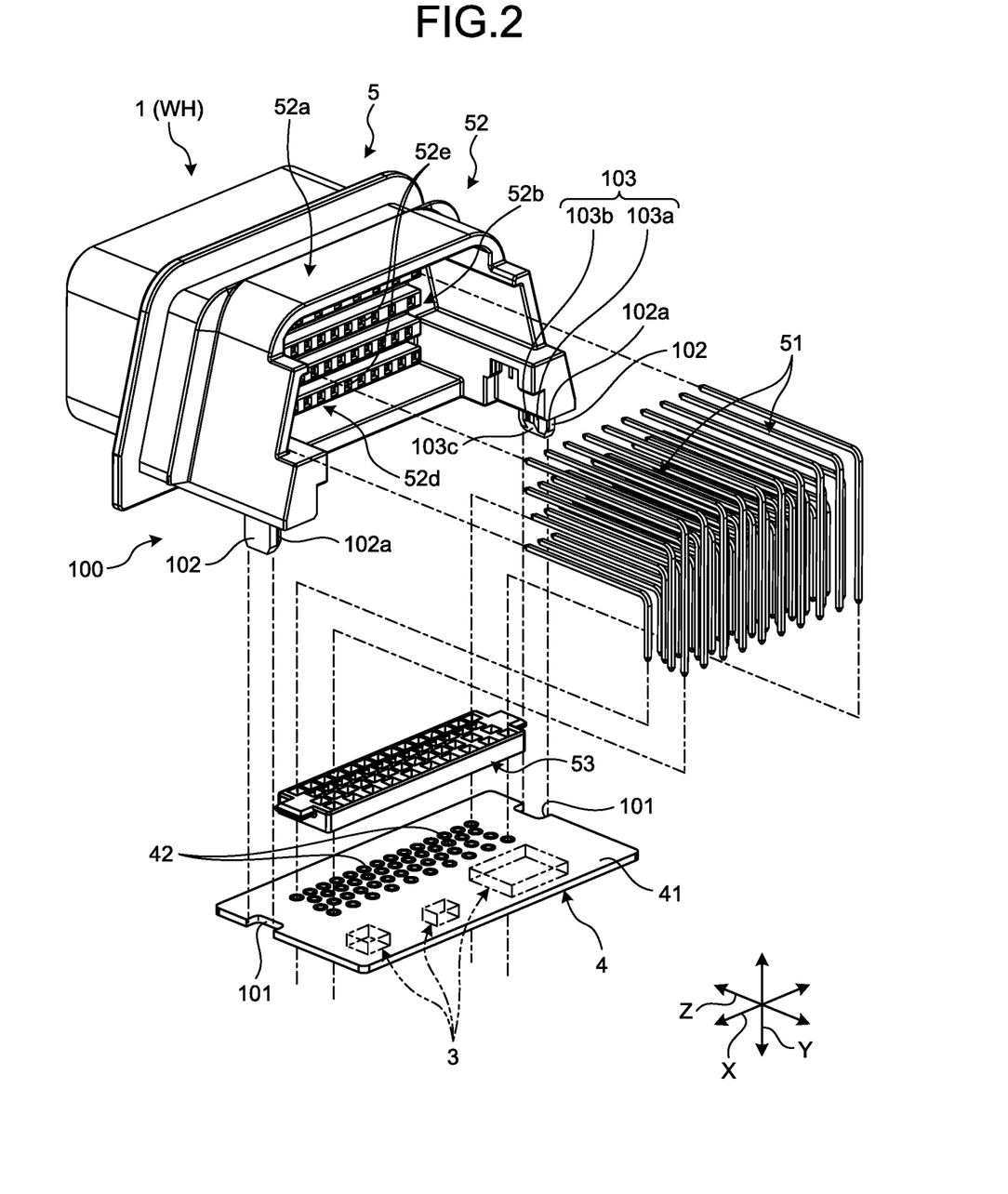
FIG. 2 is an exploded perspective view illustrating a schematic configuration of the electronic component unit according to the embodiment.

In FIG. 1, a part of a casing, a mating connector, and wiring materials are simply illustrated by two-dot chain lines, and in the other drawings, illustrations of the casing, the mating connector, and the wiring materials are omitted. In FIG. 1 and FIG. 2, a part of electronic components to be mounted on a substrate is simply illustrated by the two-dot chain lines, and in the other drawings, illustrations of the electronic components are omitted. In the following explanation, in a first direction, a second direction, and a third direction that are intersecting with each other, the first direction is referred to as a "width direction X", the second direction is referred to as a "height direction Y", and the third direction is referred to as a "depth direction Z". In this example, the width direction X, the height direction Y, and the depth direction Z are orthogonal to each other. Typically, the width direction X corresponds to a long-side direction of a substrate and an opposing direction of a pair of notches, which will be described below. Typically, the height direction Y corresponds to a plate thickness direction of the substrate, which will be described below. Typically, the depth direction Z is an intersecting direction intersecting with the width direction X and the height direction Y, and corresponds to a short-side direction of the substrate, which will be described below. Unless otherwise specified, the directions used in the following description are directions that are set while the units are assembled with each other and the electronic component unit is mounted on a vehicle.

Embodiment

For example, an electronic component unit 1 illustrated in FIG. 1 is mounted on a vehicle such as an automobile, and is incorporated in a wire harness WH. For example, the wire harness WH connects between devices mounted on the vehicle by bundling a plurality of wiring materials W used for supplying power and communicating signals into a collective component, and by connecting the wiring materials W with the devices using a connector and the like. The wire harness WH includes the wiring materials W, which is conductive, and the electronic component unit 1 that is electrically connected to the wiring materials W. For example, the wiring materials W are formed of metal rods, wires, wire bundles, and the like. The metal rods are obtained by coating the outside of a conductive rod-shaped member with an insulating coating part. The wires are obtained by coating the outside of a conductor (core wire) made of a plurality of conductive metal strands with an insulating coating part. The wire bundles are obtained by bundling the wires. In the wire harness WH, the wiring materials W are collectively bundled, and the electronic component unit 1 is electrically connected via a mating connector C or the like that is provided on the terminal of the bundled wiring materials W. The wire harness WH may also include a grommet, a protector, a fixing tool, and the like. For example, the electronic component unit 1 is installed in an engine room and the like in a vehicle and implements various functions. The electronic component unit 1 of the present embodiment can suitably fix a connector 5 by fixing the connector 5 to a substrate 4 that is housed inside a casing 2 through a connector fixing structure 100.

Hereinafter, a configuration of the electronic component unit 1 will be described in detail with reference to the accompanying drawings.

Figure 3:
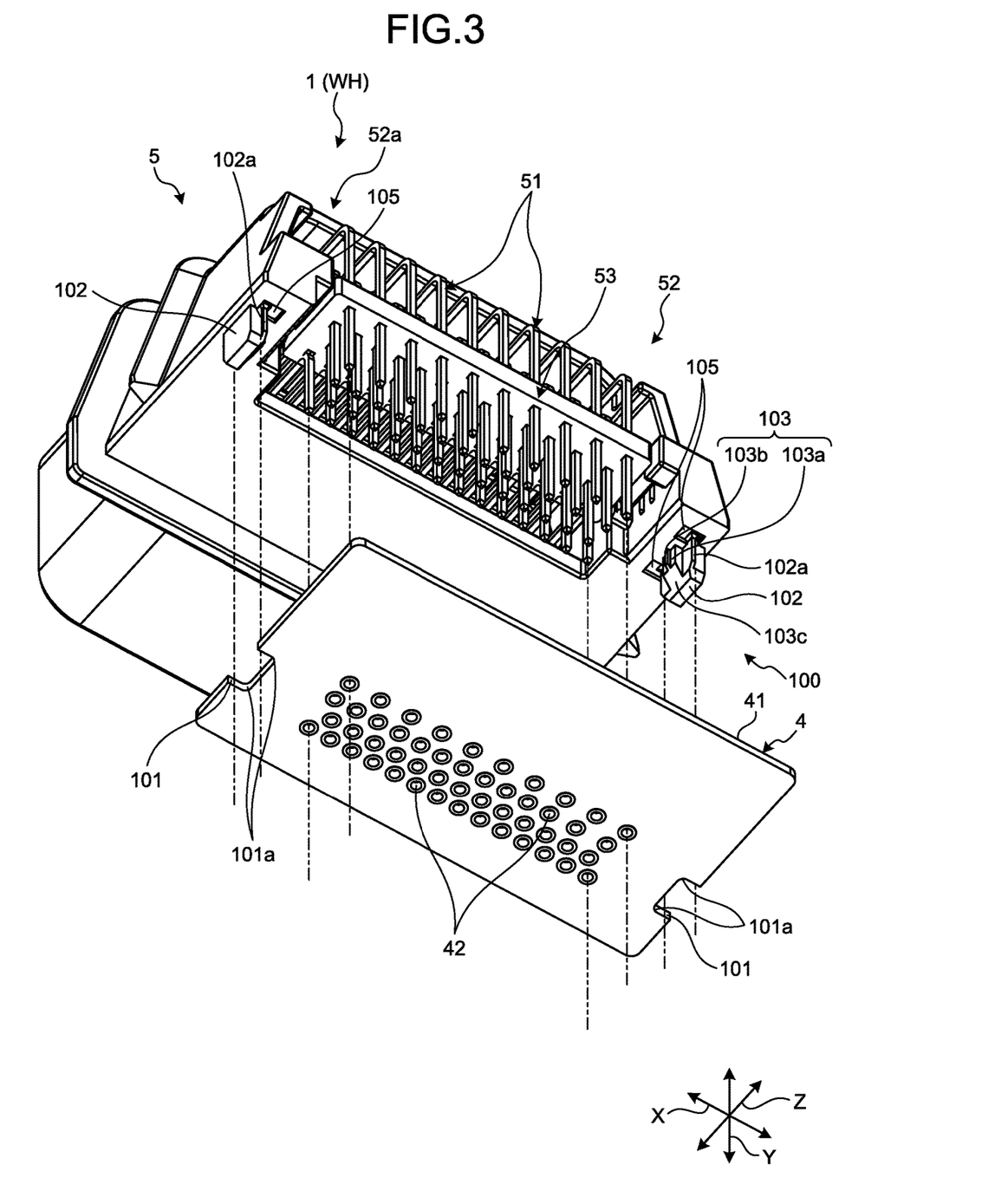
FIG. 3 is an exploded perspective view illustrating a schematic configuration of the electronic component unit according to the embodiment.
Figure 4:
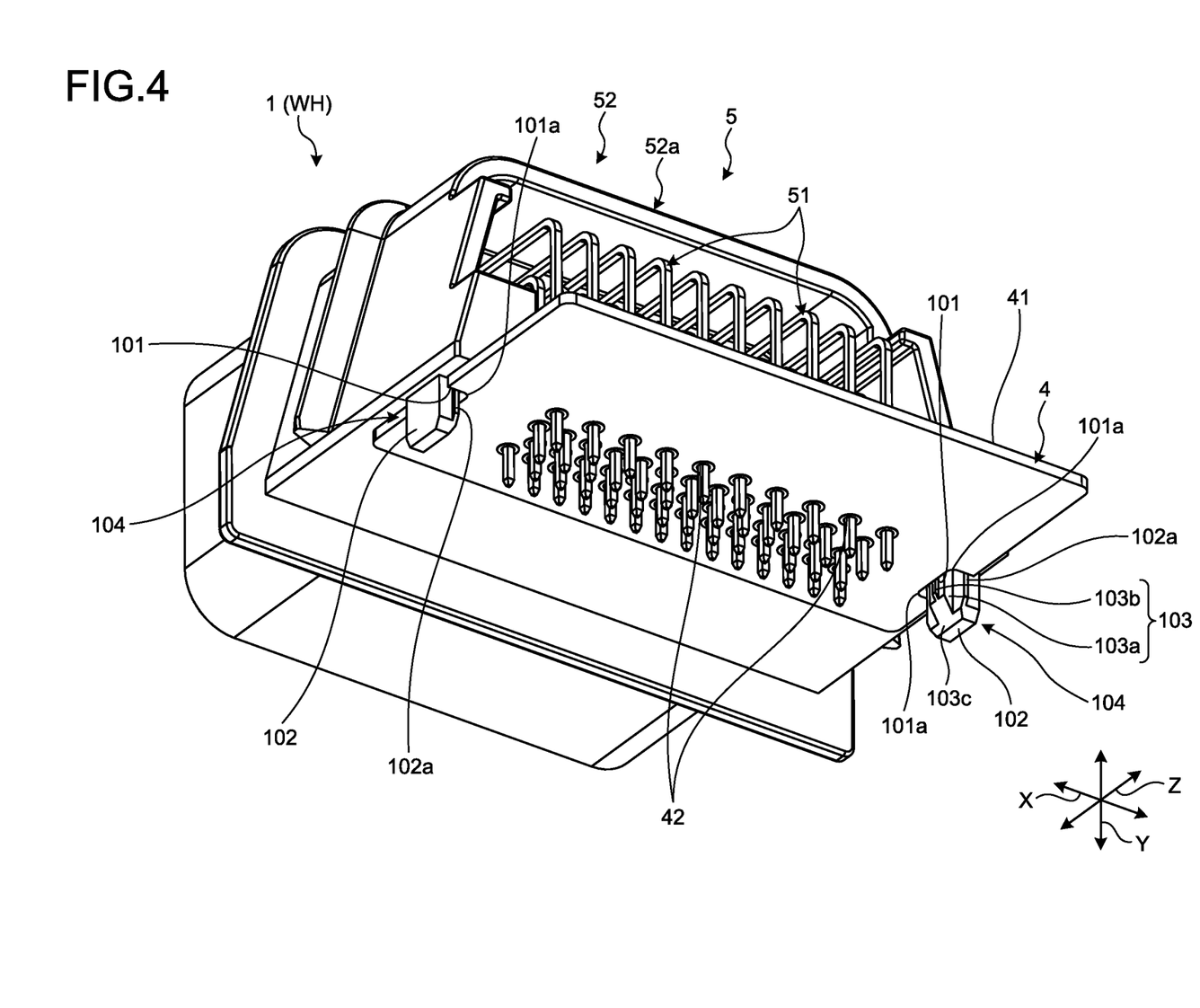
FIG. 4 is a perspective view illustrating a schematic configuration of the electronic component unit according to the embodiment.

As illustrated in FIG. 1, FIG. 2, and FIG. 3, the electronic component unit 1 of the present embodiment includes the casing 2, an electronic component 3, the substrate 4, the connector 5, and the connector fixing structure 100.

The casing 2 houses units of the electronic component unit 1. The casing 2 is made of an insulating resin material. The casing 2 has a hollow box shape, and houses the units of the electronic component unit 1 including the electronic component 3, the substrate 4, the connector 5, and the like.

The electronic component 3 is an element housed inside the casing 2 and exerts various functions. The electronic component 3 is electrically connected to the wiring materials W. The electronic component 3 is provided in plurality. For example, the electronic components 3 include a capacitor, a relay, a resistance, a transistor, a fuse, a connector, an intelligent power switch (IPS), an electronic control unit including a microcomputer, and the like.

The electronic components 3 are provided on the substrate 4, and the substrate 4 is housed inside the casing 2 with the electronic components 3. The substrate 4 is also electrically connected to the wiring materials W. The electronic components 3 are mounted on a mounting surface 41 of the substrate 4, and the substrate 4 forms an electronic circuit that electrically connects the electronic components 3. In this example, the substrate 4 is what is called a printed circuit board (PCB), for example. In the substrate 4, wiring patterns (print patterns) formed of a conductive material such as copper are printed on an insulating layer made of an insulating material such as epoxy resin, glass epoxy resin, paper epoxy resin, and a ceramic. Consequently, a circuit is configured by the wiring patterns. The substrate 4 has a substantially rectangular plate shape so that the height direction Y is the plate thickness direction, the width direction X is the long-side direction, and the depth direction Z is the extending direction of the sides. The electronic components 3 are mounted on the mounting surface 41 of the substrate 4, when lead wires and terminals of the electronic components 3 are electrically connected to the circuit by soldering and the like. In this example, the substrate 4 at least includes a plurality of through holes 42 electrically connected to the connector 5, which will be described below. Each of the through holes 42 penetrates through the substrate 4 in the height direction Y. The circuit of the substrate 4 electrically connects the electronic components 3 with the connector 5, and configures a circuit system according to the requested functions. It is to be noted that the substrate 4 is not limited to the printed circuit board, and may also be what is called an insert bus bar substrate in which a bus bar made of a conductive metal material is incorporated in the inside made of an insulating resin material. In this case, for example, the substrate 4 is obtained by coating a bus bar as a circuit made of a conductive metal material with an insulating resin material.

The connector 5 is electrically connected to the substrate 4, and forms what is called a PCB connector. The connector 5 configures a wire-to-board connection mechanism for electrically connecting the substrate 4 with the mating connector C provided on the terminal of the wiring materials W. The connector 5 includes a plurality of bent terminals 51, a connector housing 52, and an aligning plate 53. Each of the bent terminals 51 electrically connects the substrate 4 with the mating connector C.

The bent terminals 51 are configured of a metal material that is entirely conductive and the like, and conductive plating and the like is applied on the surface. Each of the bent terminals 51 is a rectangular wire formed in a rod shape and is bent in a substantially L-shape. The connector housing 52 houses and retains the bent terminals 51. Moreover, the connector housing 52 is a portion to which the mating connector C can be fitted. The connector housing 52 is made of an insulating resin material. The connector housing 52 includes a hood portion 52a, a terminal retaining portion 52b, a fitting space 52c, and a substrate side space 52d, and the connector housing 52 is integrally formed by the hood portion 52a, the terminal retaining portion 52b, the fitting space 52c, and the substrate side space 52d.

The hood portion 52a is formed in a tube shape corresponding to the exterior shape of the mating connector C. In this example, the hood portion 52a is formed in a substantially rectangular tube shape having an axis in the depth direction Z. Both ends of the hood portion 52a in the depth direction Z are opened. The terminal retaining portion 52b is formed on the middle part of the hood portion 52a in the depth direction Z, as a partition wall for closing the inside of the hollow-shaped hood portion 52a. The space inside the hood portion 52a is partitioned into the fitting space 52c and the substrate side space 52d by the terminal retaining portion 52b. The fitting space 52c is a space where a part of the bent terminals 51 is exposed and into which the mating connector C can be fitted. The substrate side space 52d is a space at the side where the substrate 4 and the like are placed. A plurality of cavities (retaining through holes) 52e (see FIG. 2) are formed on the terminal retaining portion 52b. Each of the cavities 52e penetrates through the terminal retaining portion 52b in the depth direction Z, and communicatively connects the fitting space 52c with the substrate side space 52d. The aligning plate 53 is attached to the ends of the bent terminals 51 at the side to be connected to the substrate 4, and adjusts the intervals between the bent terminals 51, aligns the bent terminals 51, and the like.

In the connector 5, one of the ends of the bent terminals 51 is press-fitted into the cavities 52e of the terminal retaining portion 52b from the substrate side space 52d side. Consequently, the terminal retaining portion 52b retains the bent terminals 51. In the connector 5, one of the ends of the bent terminals 51 is exposed in the fitting space 52c, while the terminal retaining portion 52b is retaining the bent terminals 51. In the connector 5, the other ends of the bent terminals 51 are directed toward the same side in the height direction Y, and the aligning plate 53 is attached to the other ends of the bent terminals 51.

In the connector 5, the other ends of the bent terminals 51 are electrically connected to the substrate 4. The bent terminals 51 are electrically connected to the circuit, when the respective ends of the bent terminals 51 at the aligning plate 53 side are inserted and soldered into the respective through holes 42 in the substrate 4 or the like. The mating connector C is fitted into the connector 5. Consequently, the bent terminals 51 are electrically connected to the mating connector C, and the substrate 4 is electrically connected to the wiring materials W. The connector 5 may also retain the bent terminals 51 in the terminal retaining portion 52b, by insert-molding one of the ends of the bent terminals 51 into the terminal retaining portion 52b.

As illustrated in FIG. 2, FIG. 3, FIG. 4, and FIG. 5, the connector fixing structure 100 is used to fix the connector 5 configured as the above to the substrate 4. The connector fixing structure 100 of the present embodiment includes a pair of notches 101, a pair of press fitting plates 102, a positioning rib 103, and a deformation acceptable space 104 (see especially FIG. 4 and FIG. 5).

The pair of notches 101 are portions on the substrate 4 where the connector 5 is to be fixed. The pair of notches 101 are provided facing each other on the ends of the substrate 4 in the long-side direction, in other words, on the ends of the substrate 4 in the width direction X. Each of the notches 101 penetrates through the substrate 4 in the height direction Y. The sectional shape of the notch 101 is formed in a substantially rectangular shape. More specifically, the notch 101 includes curved surface corners 101a (see especially FIG. 3 and FIG. 5) each of which is a curved corner of a substantially rectangular shape.

The pair of press fitting plates 102 are portions provided on the connector 5 and are press-fitted into the respective notches 101. The press fitting plates 102 may also be referred to as press fitting bosses. Each of the press fitting plates 102 is formed so as to project from the connector housing 52 of the connector 5 in the height direction Y. More specifically, the press fitting plate 102 is formed on a portion of the hood portion 52a of the connector housing 52 at the substrate side space 52d side. The press fitting plate 102 is formed so as to project from one of the surfaces of the portion of the hood portion 52a at the substrate side space 52d side in the height direction Y, toward the same side as the bending side of the bent terminals 51 in the height direction Y. The pair of press fitting plates 102 are placed facing each other in the width direction X. One of the pair of press fitting plates 102 is press-fitted into one of the pair of notches 101, and the other press fitting plate 102 is press-fitted into the other notch 101. The press fitting plate 102 is formed in a substantially rectangular plate shape so that the width direction X is the plate thickness direction. The press fitting plate 102 is also formed in a tapered shape so that the tip end portion is tapered. Crush ribs 102a are formed on both respective end surfaces of the press fitting plates 102 in the depth direction Z. The crush rib 102a is a portion to be crushed when the press fitting plate 102 is press-fitted into the notch 101, and is formed in a straight line in the height direction Y.

The positioning rib 103 is a portion formed projecting from each of the press fitting plates 102 in the width direction X, which is the facing direction, toward the inside in the facing direction. A single positioning rib 103 is provided for each of the press fitting plates 102. In this example, the inside in the width direction X, which is the facing direction of the press fitting plates 102, is a space side sandwiched between the pair of press fitting plates 102 that are placed facing each other in the width direction X. The positioning rib 103 is formed so as to project toward the space in the notch 101 that is surrounded by the press fitting plate 102 press-fitted into the notch 101 and the end surface of the substrate 4 forming the notch 101. A width W1 (see FIG. 5) of the positioning rib 103 in the depth direction Z is formed smaller than a width W2 (see FIG. 5) of the press fitting plate 102. The positioning ribs 103 are brought into contact with the substrate 4, while the press fitting plates 102 are press-fitted into the notches 101. The positioning ribs 103 are formed in a straight line in the height direction Y. More particularly, each of the positioning ribs 103 includes a base end portion 103a and a tip end portion 103b. The base end portion 103a is a portion placed at the press fitting plate 102 side in the width direction X, which is the facing direction, and configuring the foundation of the positioning rib 103. The tip end portion 103b is a portion placed at the substrate 4 side in the width direction X, which is the facing direction, and configuring an abutting portion of the positioning rib 103. A width W3 (see FIG. 5) of the tip end portion 103b in the depth direction Z is smaller than the width W1 of the base end portion 103a, and the tip end portion 103b is brought into contact with the substrate 4 while the press fitting plate 102 is press-fitted into the notch 101. Similar to the crush rib 102a, the tip end portion 103b also functions as a portion to be crushed when the press fitting plate 102 is pressed-fitted into the notch 101. The base end portion 103a and the tip end portion 103b are formed in a straight line in the height direction Y. In this example, a guiding tapered surface 103c is formed on the tip end of the base end portion 103a and the tip end portion 103b in the height direction Y. The tip end side of the guiding tapered surface 103c is formed in a tapered shape in the height direction Y.

The deformation acceptable space 104 is a space provided adjacent to the outside of the press fitting plates 102 that are press-fitted into the respective notches 101 in the width direction X, which is the facing direction. More specifically, a single deformation acceptable space 104 is provided for each combination of a single notch 101 and a single press fitting plate 102. In this example, the outside of the press fitting plate 102 in the width direction X, which is the facing direction, is the opposite side of the space sandwiched between the pair of press fitting plates 102 that are facing each other in the width direction X. In this example, the deformation acceptable space 104 is formed as a space outside the notch 101 than the press fitting plate 102 that is press-fitted into the notch 101. As will be described below, the deformation acceptable space 104 functions as a retraction space during thermal expansion where the press fitting plate 102 is to be retracted when the substrate 4 and the connector 5 are thermally expanded.

Moreover, in the connector fixing structure 100 of the present embodiment, a groove 105 (see FIG. 3) is formed at the root portion of each of the press fitting plates 102 in the connector housing 52. The groove 105 is provided at each of both ends of the root portion of the press fitting plate 102 in the depth direction Z. The grooves 105 are formed in a substantially rectangular recessed shape so as to surround the ends of the crush rib 102a.

In the electronic component unit 1 configured as the above, the connector 5 is fixed to the substrate 4 through the connector fixing structure 100. In other words, in the electronic component unit 1, the connector 5 is fixed to the substrate 4 when the press fitting plates 102 provided on the connector 5 are press-fitted into the notches 101 provided on the substrate 4, respectively. In this process, in the electronic component unit 1, the connector 5 can be precisely positioned to the substrate 4 in the width direction X, by bringing the positioning ribs 103 formed projecting from the press fitting plates 102 into contact with the end surface of the substrate 4.

Moreover, in this process, in the electronic component unit 1, the guiding tapered surface 103c functions as a guiding surface (collecting surface) for press-fitting the press fitting plates 102 into the notches 101, by first bringing the guiding tapered surface 103c that is formed on the positioning rib 103 into contact with the end surface of the substrate 4. Moreover, in the electronic component unit 1, scraps of resin from the portions of the crush rib 102a and the tip end portion 103b of the positioning rib 103 that are generated when the press fitting plates 102 are press-fitted into the notches 101, are to be housed in the grooves 105. Consequently, the electronic component unit 1 can prevent scraps of resin from adhering and the like to the units in the electronic component unit 1.

In the electronic component unit 1, the width W1 of the positioning rib 103 is formed smaller than the width W2 of the press fitting plate 102. Hence, the electronic component unit 1 can prevent the positioning rib 103 from interfering with the other units on the substrate 4. In this example, each of the positioning ribs 103 is brought into contact with the end surface of the substrate 4 at a flat position shifted from the curved surface corner 101a having the curved shape, while the press fitting plate 102 is press-fitted into the notch 101.

In the electronic component unit 1 of the present embodiment, the deformation acceptable space 104 is provided outside of the press fitting plate 102 that is press-fitted into the notch 101 in the width direction X, which is the facing direction, while the connector 5 is fixed to the substrate 4 through the connector fixing structure 100. In this example, in the electronic component unit 1, a high thermal load may be applied to the substrate 4 in some cases, when a lead wire, a terminal, and the bent terminals 51 of the electronic components 3 are soldered to the substrate 4 by what is called a flow method and the like, for example. Moreover, the units in the electronic component unit 1 may be thermally expanded due to the influence of the high thermal load and the like in some cases. In such cases, thermal expansion amounts between the substrate 4 and the connector housing 52 may differ due to the difference between the linear expansion coefficients of the substrate 4 and the connector housing 52. However, with the above configuration, in the electronic component unit 1, the portion of the deformation acceptable space 104 can absorb the difference between the thermal expansion amounts of the substrate 4 and the connector housing 52. In other words, in such a case, in the electronic component unit 1, the press fitting plate 102 moves relative to the notch 101 in the width direction X, corresponding to the difference between the thermal expansion amounts of the substrate 4 and the connector housing 52, while the press fitting plate 102 is press-fitted into the notch 101. Consequently, the electronic component unit 1 can move and retract the press fitting plate 102 into the deformation acceptable space 104, corresponding to the difference between the thermal expansion amounts of the substrate 4 and the connector housing 52.

Figure 5:
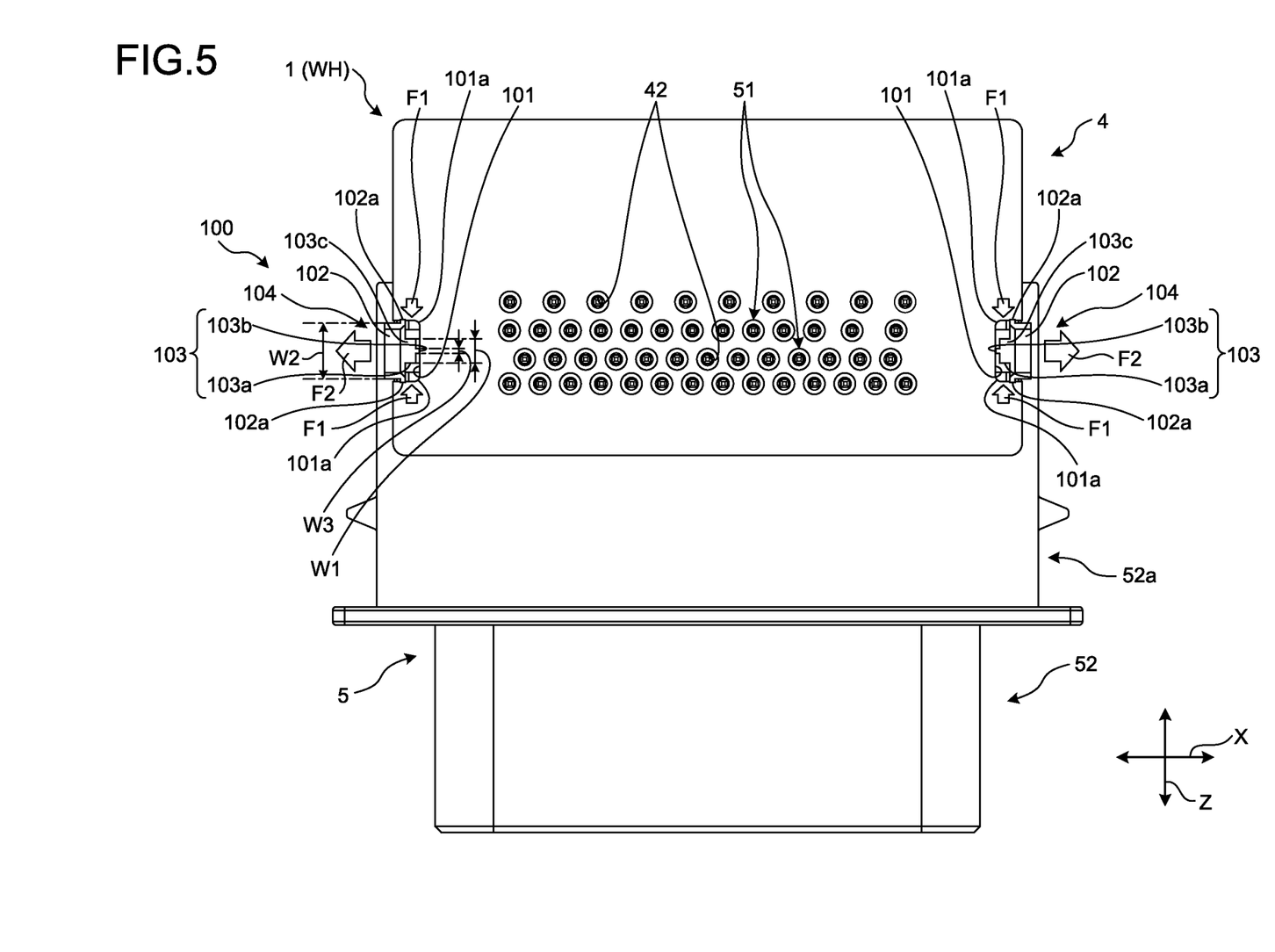
FIG. 5 is a plan view illustrating a schematic configuration of the electronic component unit according to the embodiment.

In this example, typically, the linear expansion coefficient of the substrate 4 is relatively small, and the linear expansion coefficient of the connector housing 52 is relatively large, between the substrate 4 and the connector housing 52 of the connector 5. Thus, in the electronic component unit 1, the thermal expansion amount of the substrate 4 tends to be relatively small, and the thermal expansion amount of the connector housing 52 tends to be relatively large, when the substrate 4 and the connector housing 52 are thermally expanded. Consequently, a difference is generated between the thermal expansion amounts of the substrate 4 and the connector housing 52. Typically, as illustrated in FIG. 5, the units in the electronic component unit 1 are set so that the press-fitting retaining force F1 of the press fitting plates 102 relative to the notches 101 becomes smaller than force F2 to displace the notch 101 and the press fitting plate 102 relative to each other in the width direction X during thermal expansion. As a result, in the electronic component unit 1, the press fitting plate 102 can move to the deformation acceptable space 104 side in the width direction X relative to the notch 101, and the press fitting plate 102 can be retracted in the deformation acceptable space 104 during thermal expansion.

In this manner, in the electronic component unit 1, even if the thermal expansion amounts between the substrate 4 and the connector housing 52 may differ, when a high thermal load is applied to the substrate 4, the press fitting plate 102 can move relative to the notch 101 in the width direction X. As a result, the electronic component unit 1 can prevent the press fitting plate 102 and the substrate 4 from interfering with each other during thermal expansion, and prevent an excessive stress from being applied to the substrate 4 from the press fitting plate 102.

In the electronic component unit 1, the wire harness WH, and the connector fixing structure 100 described above, the connector 5 can be fixed to the substrate 4, by press-fitting the press fitting plates 102 provided on the connector 5 into the notches 101 provided on the substrate 4, respectively. Thus, in the connector fixing structure 100, the connector 5 can be precisely positioned to the substrate 4, by bringing the positioning rib 103 that is formed projecting from the press fitting plate 102 toward the inside in the width direction X, which is the facing direction, into contact with the substrate 4. As a result, the connector fixing structure 100 can improve workability when the connector 5 is to be assembled on the substrate 4. Moreover, in this example, in the connector fixing structure 100, the guiding tapered surface 103c formed on each of the positioning ribs 103 functions as a guiding surface to press-fitting the press fitting plate 102 into the notch 101. In this respect also, the connector fixing structure 100 can improve workability when the connector 5 is to be assembled to the substrate 4. In this example, in the connector fixing structure 100, the width W1 of the positioning rib 103 is formed smaller than the width W2 of the press fitting plate 102. With this configuration, the connector fixing structure 100 can position the connector 5 to the substrate 4 as described above, while preventing the positioning rib 103 from interfering with the other units on the substrate 4.

With this configuration, the connector fixing structure 100 can relatively reduce an area where the positioning rib 103 is brought into contact with the substrate 4. Consequently, the connector fixing structure 100 can prevent excessive press-fitting.

In the connector fixing structure 100, the deformation acceptable space 104 is provided outside of the press fitting plate 102 that is press-fitted into the notch 101 in the width direction X, while the connector 5 is fixed to the substrate 4. With this configuration, in the connector fixing structure 100, even if the thermal expansion amounts between the substrate 4 and the connector 5 may differ due to the difference between the linear expansion coefficients of the substrate 4 and the connector 5, the portion of the deformation acceptable space 104 can absorb the difference between the thermal expansion amounts. In this example, in the connector fixing structure 100, the press fitting plate 102 is press-fitted and fixed in the short-side direction of the substrate 4, in this example, in the depth direction Z of the substrate 4 that tends to have a relatively small difference between the thermal expansion amounts. On the other hand, in the connector fixing structure 100, the deformation acceptable space 104 is provided outside of the press fitting plate 102 in the long-side direction of the substrate 4, in this example, in the width direction X of the substrate 4 that tends to have a relatively large difference between the thermal expansion amounts, to absorb the difference between the thermal expansion amounts. With this configuration, in the connector fixing structure 100, the press fitting plate 102 can be securely press-fitted and fixed in the depth direction Z toward which the influence of thermal expansion is small. Consequently, in the connector fixing structure 100, the difference between the thermal expansion amounts during thermal expansion can be absorbed, in the width direction X toward which the influence of the thermal expansion is large. As described above, in the connector fixing structure 100, the area where the positioning rib 103 is brought into contact with the substrate 4 is relatively reduced. Consequently, the connector fixing structure 100 can reduce the area on the substrate 4 toward which the stress from the press fitting plate 102 may be applied.

As a result, the electronic component unit 1, the wire harness WH, and the connector fixing structure 100 can suitably fix the connector 5 to the substrate 4.

Moreover, in the electronic component unit 1, the wire harness WH, and the connector fixing structure 100 described above, the positioning rib 103 includes the base end portion 103a and the tip end portion 103b. With this configuration, the connector fixing structure 100 can reliably prevent the positioning rib 103 from interfering with the other units on the substrate 4, while positioning the connector 5 on the substrate 4. Moreover, in the connector fixing structure 100, the area where the positioning rib 103 is brought into contact with the substrate 4 can be further reduced. Consequently, the connector fixing structure 100 can suppress the insertion force required to insert the press fitting plate 102 into the notch 101. In this respect also, the connector fixing structure 100 can improve workability when the connector 5 is to be assembled to the substrate 4. Consequently, the connector fixing structure 100 can securely press-fit and fix the press fitting plate 102 into the notch 101.

Furthermore, in the electronic component unit 1, the wire harness WH, and the connector fixing structure 100 described above, the positioning rib 103 is brought into contact with the end surface of the substrate 4 at the flat position shifted from the curved surface corner 101a of the notch 101. With this configuration, in the connector fixing structure 100, the connector 5 can be precisely positioned to the substrate 4, even if the notch 101 is formed so as to have the curved surface corner 101a.

In this example, in the electronic component unit 1, the wire harness WH, and the connector fixing structure 100 described above, the linear expansion coefficient of the substrate 4 is set to be relatively small, and the linear expansion coefficient of the connector housing 52 of the connector 5 is set to be relatively large. In this case, in the electronic component unit 1, the wire harness WH, and the connector fixing structure 100, the thermal expansion amount of the connector housing 52 side of the connector 5 tends to be relatively large. However, even in such a case, the electronic component unit 1, the wire harness WH, and the connector fixing structure 100 can suitably fix the connector 5 to the substrate 4.

The electronic component unit, the wire harness, and the connector fixing structure according to the embodiment of the present invention described above are not limited to those in the above described embodiment, and various modifications may be made within the scope of the appended claims.

The connector fixing structure 100 described above includes the groove 105. However, it is not limited thereto.

The substrate 4 described above has a substantially rectangular plate shape. However, it is not limited thereto. The substrate 4 may also have a substantially polygonal plate shape other than the substantially rectangular plate shape.

The positioning rib 103 described above includes the base end portion 103*a* and the tip end portion 103*b*. However it is not limited thereto.

In the electronic component unit, the wire harness, and the connector fixing structure according to the present embodiment, the connector is fixed to the substrate, by press-fitting the press fitting plates provided on the connector into the notches provided on the substrate, respectively. In the connector fixing structure, the connector can be precisely positioned to the substrate, by bringing the positioning rib formed projecting from each of the press fitting plates toward the inside in the facing direction into contact with the substrate. In this process, in the connector fixing structure, the width of the positioning rib in the intersecting direction is formed so as to be smaller than the width of the press fitting plate. Consequently, the connector fixing structure can position the connector to the substrate as described above, while preventing the positioning rib from interfering with the other units on the substrate. In the connector fixing structure, the deformation acceptable space is provided outside of the press fitting plates that are press-fitted into the respective notches in the facing direction, while the connector is fixed to the substrate. With this configuration, in the connector fixing structure, the portion of the deformation acceptable space can absorb the difference between the thermal expansion amounts, even if the thermal expansion amounts between the substrate and the connector may differ due to the difference between the linear expansion coefficients of the substrate and the connector. As a result, the electronic component unit, the wire harness, and the connector fixing structure exhibit advantageous effects of being able to suitably fix the connector to the substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit, comprising:
a substrate on which an electronic component is mounted;
a connector electrically connected to the substrate; and
a connector fixing structure including:
   a pair of notches that are provided facing each other on the substrate in a facing direction and that penetrate through the substrate in a plate thickness direction,
   a pair of press fitting plates that are provided on the connector and that are press-fitted into the respective notches,
   a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches, and
   a deformation acceptable space that is provided adjacent to outside of the press fitting plates that are press-fitted into the respective notches, in the facing direction,
wherein at least one of the press fitting plates and at least one of the positioning ribs are formed along the plate thickness direction,
wherein the positioning rib is formed so as to project toward a space in at least one of the notches that is surrounded by the at least one of the press fitting plates press-fitted into the at least one of the notches and an end surface of the substrate forming the at least one of the notches, and
wherein, in a longitudinal direction of the substrate, the at least one of the notches and the end surface are formed on an outermost edge of the substrate.

2. The electronic component unit according to claim 1, wherein
the positioning rib includes a base end portion that is placed at the press fitting plate side in the facing direction, and a tip end portion that is placed at the substrate side in the facing direction, that has a width in the intersecting direction smaller than a width of the base end portion, and that is brought into contact with the substrate while the press fitting plates are press-fitted into the respective notches.

3. The electronic component unit according to claim 1, wherein
a corner of the notches is formed in a curved-shape, and
the positioning rib is brought into contact with the substrate at a position shifted from the corner having the curved-shape while the press fitting plates are press-fitted into the respective notches.

4. The electronic component unit according to claim 2, wherein
a corner of the notches is formed in a curved-shape, and
the positioning rib is brought into contact with the substrate at a position shifted from the corner having the curved-shape while the press fitting plates are press-fitted into the respective notches.

5. The electronic component unit according to claim 1, wherein
between the substrate and the connector, a linear expansion coefficient of the substrate is relatively small, and a linear expansion coefficient of the connector is relatively large.

6. The electronic component unit according to claim 2, wherein
between the substrate and the connector, a linear expansion coefficient of the substrate is relatively small, and a linear expansion coefficient of the connector is relatively large.

7. The electronic component unit according to claim 3, wherein
between the substrate and the connector, a linear expansion coefficient of the substrate is relatively small, and a linear expansion coefficient of the connector is relatively large.

8. The electronic component unit according to claim 4, wherein
between the substrate and the connector, a linear expansion coefficient of the substrate is relatively small, and a linear expansion coefficient of the connector is relatively large.

9. A wire harness, comprising:
a conductive wiring material; and
an electronic component unit electrically connected to the wiring material, wherein
the electronic component unit includes:
   a substrate on which an electronic component electrically connected to the wiring material is mounted,
   a connector electrically connected to the substrate, and
   a connector fixing structure including:
      a pair of notches that are provided facing each other on the substrate in a facing direction and that penetrate through the substrate in a plate thickness direction,
      a pair of press fitting plates that are provided on the connector and that are press-fitted into the respective notches,
      a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches, and
      a deformation acceptable space that is provided adjacent to outside of the press fitting plates that are press-fitted into the respective notches, in the facing direction,
   wherein at least one of the press fitting plates and at least one of the positioning ribs are formed along the plate thickness direction,
   wherein the at least one of the positioning ribs is formed so as to project toward a space in at least one of the notches that is surrounded by the at least one of the press fitting plates press-fitted into the at least one of the notches and an end surface of the substrate forming the at least one of the notches, and
   wherein, in a longitudinal direction of the substrate, the at least one of the notches and the end surface are formed on an outermost edge of the substrate.

10. A connector fixing structure, comprising:
a pair of notches that are provided facing each other on a substrate on which an electronic component is mounted in a facing direction and that penetrate through the substrate in a plate thickness direction;
a pair of press fitting plates that are provided on a connector electrically connected to the substrate and that are press-fitted into the respective notches;
a positioning rib that is formed projecting from each of the press fitting plates in the facing direction toward inside in the facing direction, that has a width in an intersecting direction intersecting with the facing direction and the plate thickness direction smaller than a width of the press fitting plates, and that is brought into contact with the substrate while the press fitting plates are press-fitted into the respective notches; and
a deformation acceptable space that is provided adjacent to outside of the press fitting plates that are press-fitted into the respective notches, in the facing direction,
wherein at least one of the press fitting plates and at least one of the positioning ribs are formed along the plate thickness direction,
wherein the at least one of the positioning ribs is formed so as to project toward a space in at least one of the notches that is surrounded by at least one of the press fitting plates press-fitted into at least one of the notches and an end surface of the substrate forming the at least one of the notches, and
wherein, in a longitudinal direction of the substrate, the at least one of the notches and the end surface are formed on an outermost edge of the substrate.

* * * * *